United States Patent

Nowak et al.

[11] Patent Number: 6,066,952
[45] Date of Patent: May 23, 2000

[54] METHOD FOR POLYSILICON CRYSTALLINE LINE WIDTH MEASUREMENT POST ETCH IN UNDOPED-POLY PROCESS

[75] Inventors: Edward J. Nowak, Essex Junction; James C. Li, Essex, both of Vt.

[73] Assignee: International Business Machnies Corporation, Armonk, N.Y.

[21] Appl. No.: 08/938,439

[22] Filed: Sep. 25, 1997

[51] Int. Cl.[7] .................................................. G01R 29/12
[52] U.S. Cl. ......................... 324/458; 324/767; 324/642
[58] Field of Search ................................... 324/719, 713, 324/671, 561, 765, 769, 458, 642

[56] References Cited

U.S. PATENT DOCUMENTS

| | | |
|---|---|---|
| 4,003,126 | 1/1977 | Holmes et al. . |
| 4,048,649 | 9/1977 | Bohn . |
| 4,191,963 | 3/1980 | Schmidt et al. . |
| 4,243,997 | 1/1981 | Natori et al. . |
| 4,296,429 | 10/1981 | Schroeder . |
| 4,346,348 | 8/1982 | Bartoli et al. ............ 324/158 R |
| 4,453,127 | 6/1984 | Schick ......................... 324/71.3 |
| 4,453,305 | 6/1984 | Janes et al. . |
| 4,455,740 | 6/1984 | Iwai . |
| 4,499,651 | 2/1985 | Kohn . |
| 4,542,340 | 9/1985 | Chakravarti et al. ........ 324/158 R |
| 4,571,815 | 2/1986 | Baliga et al. . |
| 5,065,103 | 11/1991 | Slinkman et al. ............ 324/458 |
| 5,081,414 | 1/1992 | Kusama et al. ............ 324/158 D |
| 5,485,097 | 1/1996 | Wang .......................... 324/765 |
| 5,623,152 | 4/1997 | Majumdar et al. . |
| 5,650,731 | 7/1997 | Fung et al. ................... 324/752 |
| 5,821,766 | 10/1998 | Kim et al. .................... 324/769 |

FOREIGN PATENT DOCUMENTS 2 526 586  11/1983  France .

*Primary Examiner*—Josie Ballato
*Assistant Examiner*—Vincent Q. Nguyen
*Attorney, Agent, or Firm*—Scully, Scott, Murphy & Presser; Howard J. Walter Jr., Esq.

[57] ABSTRACT

A method of measuring a width of an undoped or lightly doped polysilicon line is disclosed. The width measuring method includes generating carriers in the polysilicon line with an energy source; measuring a capacitance between the polysilicon line and a substrate separated from the polysilicon line by a dielectric layer; and determining a line width of the polysilicon line from the measured capacitance. The capacitance measurement includes connecting first and second probes to the polysilicon line; connecting a third probe to the substrate; connecting a first terminal of a capacitance meter to the first and second probes; connecting a second terminal of the capacitance meter to the third probe; and applying a direct current bias across the first and second probes. A capacitor may be connected between the first and second probes. Further steps include, connecting a fourth probe to a conductor that supports the substrate; and connecting the fourth probe to the third probe.

6 Claims, 4 Drawing Sheets

METHOD FOR POLYSILICON CRYSTALLINE LINE WIDTH MEASUREMENT POST ETCH IN UNDOPED-POLY PROCESS

BACKGROUND OF THE INVENTION

1. Field of the Invention

The present invention is directed to a method for polysilicon crystalline (PC) line width measurement post etch in undoped-polysilicon process, and more particularly, to a method for in line electrical measurement of a polysilicon (poly) line width dimension post PC etch prior to doping of the poly.

2. Discussion of the Prior Art

Advanced CMOS and MOSFET circuits, such as 0.35 µm and 0.25 µm generation circuits, have increasingly narrow gate sizes, that are formed by etching a polysilicon layer. After etching the polysilicon layer, which is undoped and also referred to as an intrinsic poly layer, the dimension of the remaining gate is measured to ascertain that the remaining polysilicon gate has the desired dimension, such as the desired line width. Measuring the poly gate line width is typically used for controlling the effective channel length, $L_{eff}$, located in the substrate below the poly gate and along the gate width between the source and drain of the MOSFET.

MOSFETs having a short effective channel length $L_{eff}$ are desirable, since they are smaller and operate at higher and faster frequencies. Short channel lengths also require narrow gate widths. Typically, the length of the channel is approximately the width of the poly gate.

Conventional measurements of channel lengths or poly gate widths have been performed by measuring electrical characteristics of the poly gate after doping thereof. Doping the poly gate is necessary in order to render the poly gate electrically active so that electrical measurements can be performed. From the electrical measurements of the doped poly gate, the quality of the poly layer etch that patterns and forms the poly gate is determined. In particular, the dimension, such as the width, of the patterned poly gate is determined from the electrical measurements of the doped poly gate.

During semiconductor device or MOSFET integrated circuit (IC) fabrication, due to the increasingly small gate dimensions, rapid feedback of the MOSFET poly layer etch that forms the gate, and measurement of the gate line width, are no longer achieved due to the use of undoped polysilicon in 0.5 µm through 0.25 µm generation integrated circuits (ICs), for example. Further, since undoped polysilicon is not a good electrical conductor, it is not possible to electrically determine the width of the polysilicon gate, hence the quality of the polysilicon layer etch that forms the gate, by measuring electrical characteristics of the undoped polysilicon gate.

The inability to rapidly measure polysilicon gate line widths delays electrical characterization of the MOSFET ICs several weeks, where in the meantime, other process steps have been completed. For example, electrical characterization is delayed to post source/drain anneal. This results in a greater risk to the wafer in process for sorting the manufactured MOSFETs according to their operating speed, which is directly related to the channel length or the gate width.

Accordingly, there is a need to provide a method to accurately and rapidly measure electrical characteristics of intrinsic/undoped or lightly doped polysilicon lines to determine line widths thereof.

SUMMARY OF THE INVENTION

The object of the present invention is to provide a method of measuring dimensions of a polysilicon (poly) strip formed by etching a poly layer in an undoped or lightly doped polysilicon process that eliminates the problems of conventional measurement methods.

Another object of the present invention is to provide a method of measuring dimensions of the poly strip rapidly and accurately.

Yet another object of the present invention is to provide an early electrical measurement of an intrinsic undoped or lightly doped polysilicon line width post etching an undoped (or lightly doped) poly layer.

A further object of the present invention is to provide a capacitive line width measurement of intrinsic or lightly doped polysilicon.

A still further object of the present invention is to simplify measurement setup of poly line width measurements.

These and other objects of the present invention are achieved by a method of measuring a width of an undoped or lightly doped polysilicon line comprising the steps of:

generating carriers in the polysilicon line with an energy source;

measuring a capacitance between the polysilicon line and a substrate separated from the polysilicon line by a dielectric layer; and determining a line width of the polysilicon line from the measured capacitance.

Illustratively, the energy source is a heat or light source. Thus, the carriers in the polysilicon line are generated by heat or exposure to light.

The line width determining step includes measuring a capacitance per unit area associated with the polysilicon line, namely, with the polysilicon line/gate-oxide/substrate structure; and determining a capacitance per unit length of the polysilicon line. The length of the polysilicon line is known by design and is used to approximate a perimeter thereof. Illustratively, the capacitance per unit length determining step includes simulating with a computer model the polysilicon line to determine the capacitance due to edge fringing fields.

The capacitance measurement is performed in accordance to another embodiment of the present invention. In particular, a method of measuring capacitance between a substrate having a dielectric layer formed thereon and a polysilicon formed on the dielectric layer comprises the steps of:

electrically connecting first and second probes to the polysilicon;

electrically connecting a third probe to the substrate;

electrically connecting a first terminal of a capacitance meter to the first probe;

electrically connecting a second terminal of the capacitance meter to the third probe; and applying a direct current bias across the first and second probes.

A further step includes connecting a capacitor between the first and second probes. The capacitance measuring method further comprises generating carriers in the polysilicon with an energy source. Additional steps include:

electrically connecting a fourth probe to a conductor that supports the substrate; and electrically connecting the fourth probe to the third probe.

Another embodiment of the present invention includes a method of providing a contact to a substrate, where the contact provides both zero frequency, i.e. direct current (DC), and higher frequency electrical connection into the substrate. This method includes connecting the contact to both the substrate and a conductor that is separated from the substrate by a dielectric layer.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE INVENTION

Figure 1:
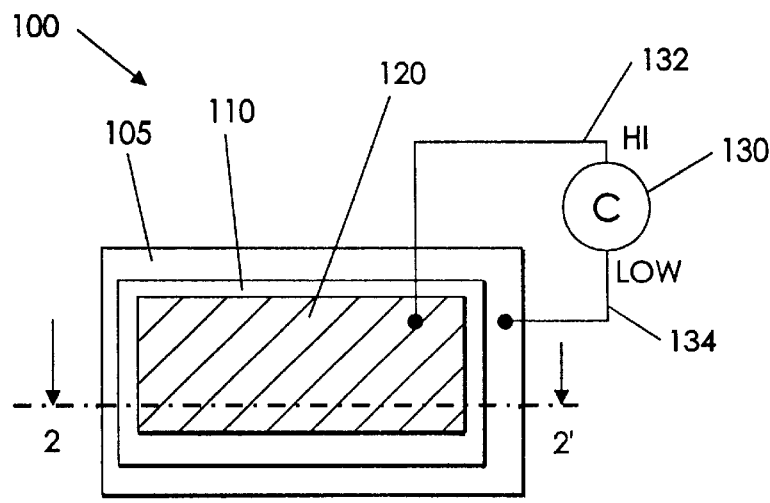
FIG. 1 shows a capacitance per unit area measurement setup according to the present invention.
Figure 4:
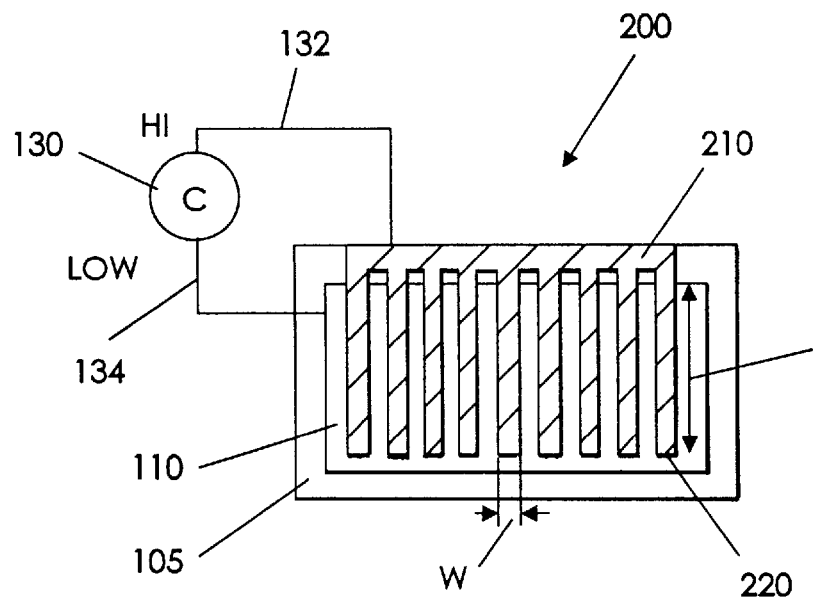
FIG. 4 shows a capacitive line-width measurement setup according to the present invention.

FIG. 1 shows a top view of an initial setup 100 according to the present invention to measure a capacitance per unit area, for use in determining narrow line-widths of fingers of the gate of a semiconductor device, such as a MOSFET, using capacitive measurements of the fingered gate, shown as reference number 210 in FIG. 4. As shown in FIG. 1, a substrate 105 has a gate oxide layer 110 formed thereon. An undoped or intrinsic polysilicon layer 120 is formed over the gate oxide layer 110. The polysilicon layer 120, which may be undoped or lightly doped, is later patterned and doped to form the gate of the semiconductor device.

Figure 2:
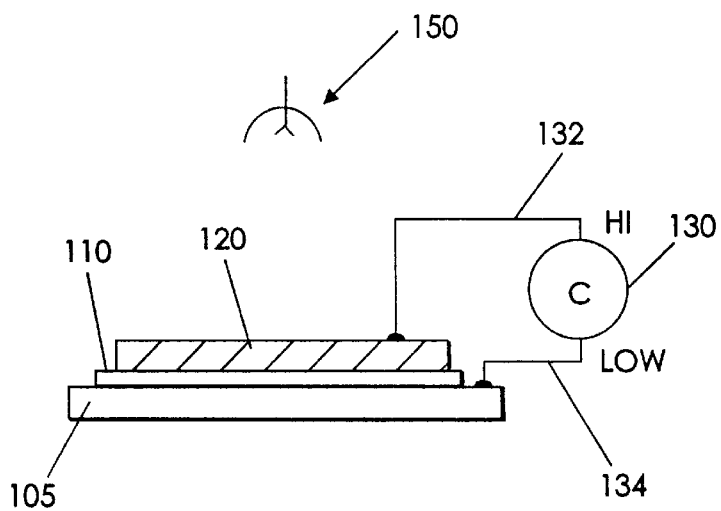
FIG. 2 shows a cross sectional view of FIG. 1 along the line 2–2' according to the present invention.

A capacitor meter 130 is connected between the substrate 105 and the intrinsic polysilicon layer 120. Illustratively, the positive or high terminal 132 of the capacitor meter 130 is connected to the intrinsic polysilicon layer 120, while the negative or low terminal 134 is connected to the substrate 105. FIG. 2 is a cross sectional view of FIG. 1 along the line 2–2'.

Figure 3:
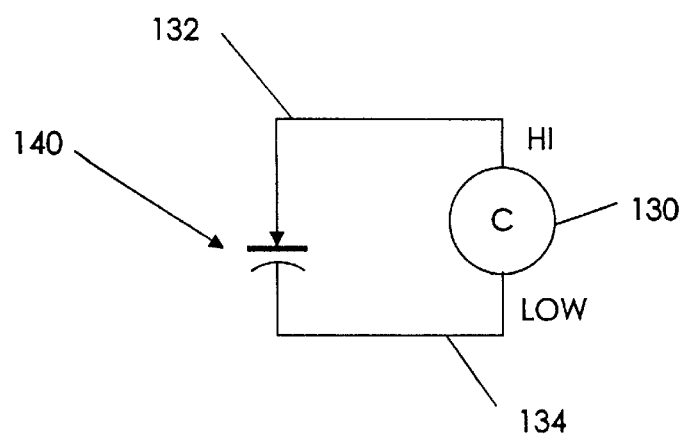
FIG. 3 shows an equivalent circuit of FIG. 1 according to the present invention.

FIG. 3 is an equivalent circuit of FIG. 1, where the substrate 105 and the intrinsic polysilicon layer 120 represent plates of a capacitor 140, and the gate oxide layer 120 represents the dielectric material located between the plates of the capacitor 140.

The polysilicon layer 120 has minimal electrical conductivity since it is not doped or lightly doped. Instead of doping the polysilicon layer 120, which is conventionally done after patterning the polysilicon layer 120 to obtain the proper gate dimensions, an external energy source is used to provide or enhance electrical characteristics of the polysilicon layer 120. The energy source enhances electrical characteristics by generating carriers in the polysilicon layer 120. Illustratively, the external energy source is an optical light, such as a low power laser and/or heat, where the setup 100 is heated up to approximately 200° C. for approximately one minute, for example. FIG. 2 shows the energy source as an optical light source 150.

The area of the polysilicon layer 120 is large, with physical dimensions that are large enough to render negligible tolerances of the dimensions.

Illustratively, the polysilicon layer 120 is 100 $\mu$m long and 100 $\mu$m wide.

After generating carriers in the polysilicon layer 120, capacitance per unit area $C_{ox}$ of the thin gate oxide layer portion, which is located between the polysilicon layer 120 and the substrate 105, is measured with the capacitor meter 130. As will be explained, the capacitance per unit area $C_{ox}$ is used to determine width of fingers formed from patterning and etching the polysilicon layer 120, or patterning polysilicon layers of other devices having a gate oxide and polysilicon layers which are of a similar size as those of the structure 100 shown in FIG. 1.

FIG. 4 shows a top view of a structure 200 having a similar size as the structure 100 shown in FIG. 1. In FIG. 4, an intrinsic polysilicon layer is patterned and etched to form a fingered gate 210, having fingers 220. Each finger portion located over the gate oxide layer 110 has a length L and a width W. The finger width W is the minimum critical dimension and the finger length L is large enough so that the tolerance in finger dimensions is negligible.

The capacitance meter 130 is used to measure the capacitance $C_m$ of the fingered polysilicon layer 210. This measured capacitance $C_m$ is given by equation (1):

$$C_m = [(C_{ox} \times W) + C_{of}] \times P/2 \tag{1}$$

where:

$C_{ox}$ is the capacitance per unit area of the thin oxide layer 110, as measured by the capacitance meter 130 using the setup 100 shown in FIG. 1;

W is the physical line width of the finger 220 shown in FIG. 4;

$C_{of}$ is the finger outer fringe capacitance per unit length, or the capacitance per unit length of the fingers 220 due to edge effects, and is obtained through computer simulation of the structure 200; and P is the perimeter of the fingered intrinsic poly 210 located over the thin gate oxide 120.

The polysilicon line is formed to have a length which is larger than a critical dimension or feature size. Accordingly, the polysilicon line length is known by design, and is used to approximate the perimeter P thereof.

Equation (1) is solved for the finger width W to yield equation (2):

$$W = [C_m/((P/2) \times C_{ox})] - C_{of}/C_{ox} \tag{2}$$

Thus, using equation (2), the finger width W of the fingered gate 210 is determined from capacitive measurements of the rectangular gate 120 shown in FIG. 1, and of the fingered gate 210 shown in FIG. 4, knowing the length L and the number N of the fingers 220. The finger width measurement is performed without the need to dope the intrinsic gate polysilicon, thus providing rapid feedback of the poly gate etch that forms the gated fingers. Accordingly, the finger widths and electrical characterization of the semiconductor device having the fingered gate are quickly determined, without having to wait till after forming the source and drain regions, and without the need to dope the gate polysilicon.

The gate polysilicon has a high resistance, since it is not doped and, thus, has a low carrier concentration. To reduce the resistance of the gate poly, and form a low contact resistance to the intrinsic gate poly, a two point probe is used.

Figure 5:
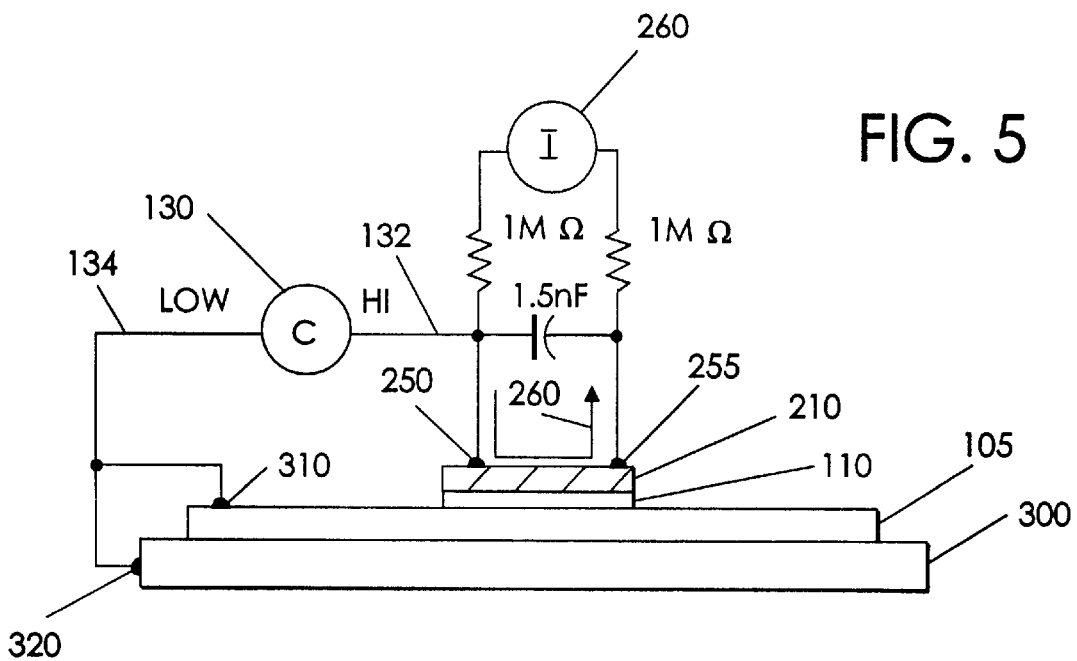
FIG. 5 shows a capacitive measurement setup with a two point gate contact and wafer and chuck probes according to the present invention.

The capacitance measurement is performed in accordance to another embodiment of the present invention shown in FIG. 5. Similar to that shown in FIG. 2, in FIG. 5, the capacitance meter 130 is connected between the gate poly electrode 210 and the substrate 105. However, instead of connecting one terminal the capacitance meter 130, e.g., the high terminal 132, to a single probe contacting the gate poly electrode 210, two probes 250, 255 are electrically connected to the gate poly electrode 210, one via a capacitor.

To reduce the resistance of the intrinsic gate poly electrode 210, carriers therein are generated by an external energy source, such as heat or light, using for example the light source 150 shown in FIG. 2. To further reduce the resistance of the surface contact, such as the resistance of the intrinsic (or lightly doped) gate poly 210 under optical or thermal excitation, a direct current (DC) bias is applied through the two probes 250, 255. Illustratively, the DC bias is provided by a current source 260 connected between the two probes 250, 255.

Figure 6:
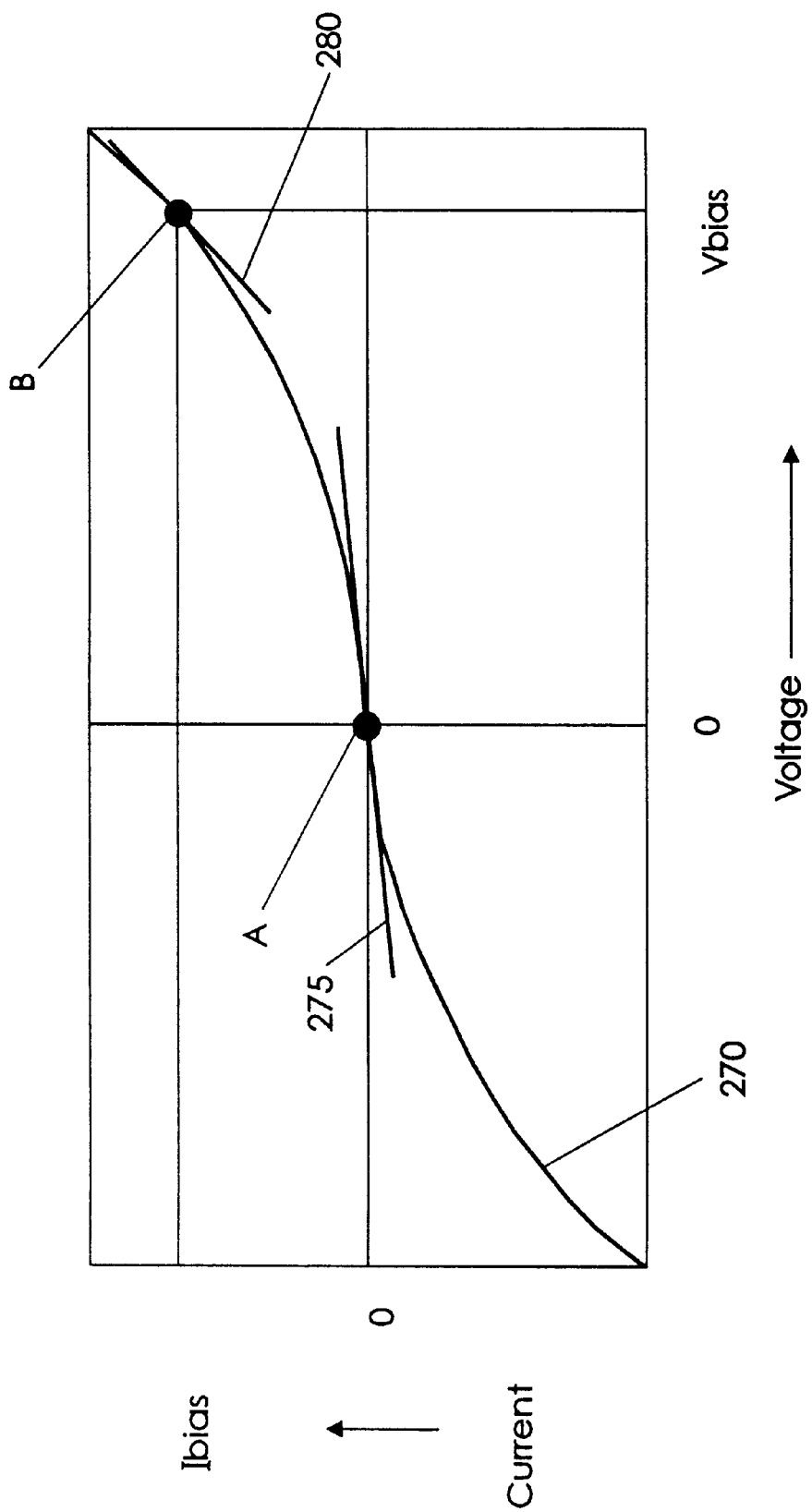
FIG. 6 shows a current-voltage waveform of a low carrier concentration semiconductor substrate according to the present invention.

Contact to semiconductors with low carrier concentrations is highly non-ohmic, and gives rise to current-voltage characteristics 270 shown in FIG. 6. For very low voltages and currents, such as at an operating point A shown in FIG. 6, the small-signal impedance dV/dI is very high, as shown by the nearly horizontal tangent 275 to the current-voltage characteristics 270 at the low voltage and current operating point A.

By applying the DC bias across the two probes 250, 255 shown in FIG. 5, a large current in induced in the gate poly 210. This changes the operating point from A to B, as shown in FIG. 6. At the high voltage and current operating point B, the small-signal impedance dV/dI is greatly reduced.

In particular, the slope of the tangent 275 at operating point A, where the slope dI/dV is the inverse of the small-signal impedance dV/dI, is larger than the slope of the tangent 280 at operating point B. Thus, the small-signal impedance dV/dI at operating point B is smaller than the small-signal impedance at operating point A. Reducing the small-signal impedance dV/dI, allows accurate differential capacitance measurements on semiconductors with relatively low carrier concentration, such as the intrinsic gate poly 210 under optical or thermal excitation.

To provide the proper DC current 260 flowing through the intrinsic gate poly electrode 210, between the two probes 250, 255, bias resistors and capacitors are used. Illustratively, a 1 MΩ resistor has a first terminal connected to one terminal of the current source 260 and a second terminal connected to the first probes 250; and another 1 MΩ resistor has its first terminal connected to the other terminal of the current source 260 and its second terminal connected to the second probes 255. In addition, a 1.5 nF capacitor is connected between the two second terminals of the two 1 MΩ resistors, for example, which two terminals are also connected to the two probes 250, 255, respectively.

Capacitance measurements are performed using the capacitance meter 130, which has one terminal, e.g., the high terminal 132, connected to one of the probes contacting the gate poly 210, such as the first probe 250. The other terminal, e.g., the low terminal 134, of the capacitance meter 130 is connected to the substrate 105. Furthermore a D.C. bias voltage is provided (e.g. by the capacitance meter 130) to either invert or accumulate the substrate silicon at the oxide interface.

As shown in FIG. 5, to assure both good DC and high frequency contact to the substrate wafer 105, the substrate 105 is placed on a conductor, referred to as a chuck 300, and the low terminal 134 of the capacitance meter 130 is connected to the chuck 300. Thus, the low capacitance meter terminal 134 is connected to both a substrate probe 310 that electrically contacts the substrate 105, and a chuck probe 320 that electrically contacts the chuck 300.

Figure 7:
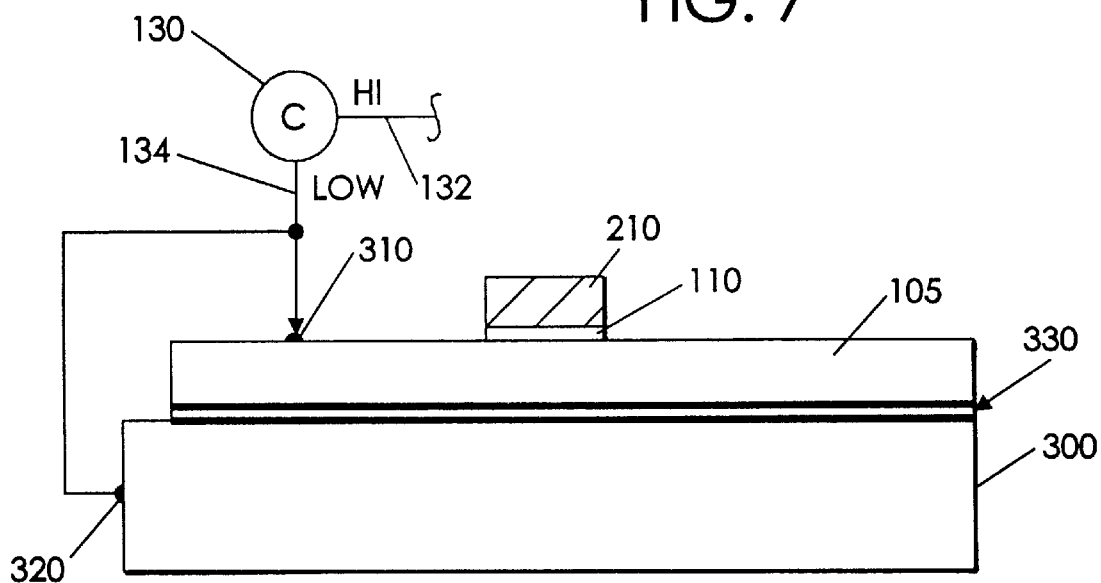
FIG. 7 shows in greater detail the wafer and chuck probes shown in FIG. 5 according to the present invention.

FIG. 7 shows in greater detail the two probes 310, 320 contacting the substrate 105 and chuck 300, respectively. The substrate probe 310 electrically contacts a region of the substrate 105 which is not covered by the gate oxide 110 and gate poly 210. Illustratively, the substrate 105 is lightly doped silicon with P-type material. Due to the small contact area and low doping of the substrate 105, the substrate contact or probe 310 provides a DC contact of very high impedance. While this is adequate to maintain a proper DC bias, it is not adequately sufficient for the high frequency current that the capacitance meter 130 requires for accurate capacitance measurements.

To improve capacitance measurement, the second contact or chuck probe 320 is provided to electrically contact the chuck 300 located on the back side of the wafer or substrate 105, which back side is opposite the front substrate side having the gate 210 formed thereon. Illustratively, the back side of the substrate 105 is coated with various insulating films 330 which block direct current (DC) and separate the chuck 300 from the substrate 105. The wafer chuck 300 provides a high capacitance to the entire back side of the wafer 105.

Figure 8:
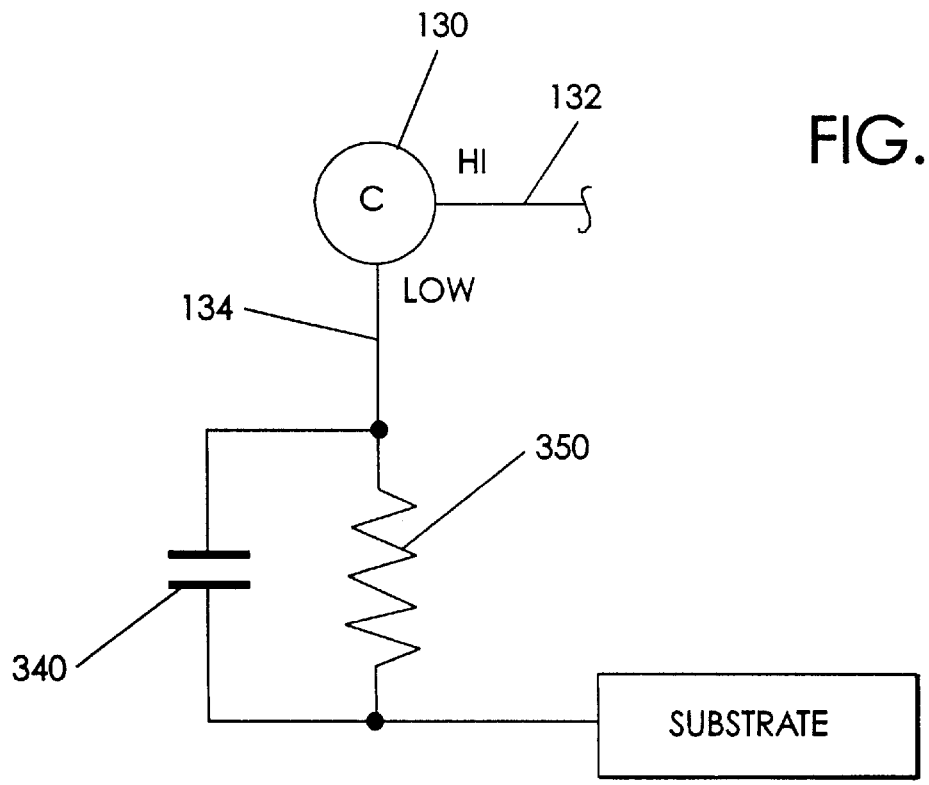
FIG. 8 shows an equivalent circuit of the two wafer and chuck probes shown in FIG. 7 according to the present invention.

FIG. 8 shows an equivalent circuit of the wafer and chuck probes 310, 320, where the chuck capacitance is shown as a capacitor 340 connected in parallel to a resistor 350, which is the equivalent of the high impedance wafer front side contact 310 (FIG. 7). Thus, the wafer and chuck probes 310, 320, shown in FIG. 7, provide a good DC contact at the wafer probe 310, in parallel with a good high frequency probe or contact at the chuck probe 320. This allows capacitive line-width measurements, as described in connection with FIGS. 1–4, to be performed without special processing for contacting the wafer 105.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A method of measuring a width of an undoped polysilicon line comprising the steps of:

providing an undoped polysilicon line:

generating carriers in the polysilicon line with an energy source;

measuring a capacitance between the polysilicon line and a substrate separated from the polysilicon line by a dielectric layer; and determining a line with of said polysilicon line from the measured capacitance.

2. The method of claim 1, wherein the line width determining step includes the steps of:

measuring a capacitance per unit area of said polysilicon line; and determining a capacitance per unit length of said polysilicon line.

3. The method of claim 2, wherein the capacitance per unit length determining step includes simulating a computer model of said polysilicon line.

4. The method of claim 1, wherein the capacitance measuring steps includes the steps of:

electrically connecting first and second probes to said polysilicon line;

electrically connecting a third probe to a substrate on which said dielectric layer is formed;

electrically connecting a first terminal of a capacitance meter to said first probe;

electrically connecting a second terminal of said capacitance meter to said third probe; and applying a direct current bias across said first and second probes.

5. The method of claim 4 further comprising connecting a capacitor between said first and second probes.

6. The method of claim 4 further comprising the steps of:

electrically connecting a fourth probe to a conductor that supports said substrate; and electrically connecting said fourth probe to said third probe.

* * * * *

UNITED STATES PATENT AND TRADEMARK OFFICE
CERTIFICATE OF CORRECTION

PATENT NO. : 6,066,952
DATED : May 23, 2000
INVENTOR(S) : Edward J. Nowak, et al.

It is certified that error appears in the above-identified patent and that said Letters Patent are hereby corrected as shown below:

On The Title Page, [73] Assignee: "Machnics" should read --Machines--

Column 6, Line 58: "line:" should read --line;--

Signed and Sealed this

Seventeenth Day of April, 2001

Attest:

NICHOLAS P. GODICI

*Attesting Officer*   Acting Director of the United States Patent and Trademark Office